United States Patent
Lam et al.

(10) Patent No.: US 10,285,291 B1
(45) Date of Patent: May 7, 2019

(54) LINE CARD EJECTOR WITH EMERGENCY RELEASE

(71) Applicant: CISCO TECHNOLOGY, INC., San Jose, CA (US)

(72) Inventors: Mandy Hin Lam, Fremont, CA (US); Vic Hong Chia, Sunnyvale, CA (US); Keith Frank Tharp, San Jose, CA (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 15/898,576

(22) Filed: Feb. 17, 2018

(51) Int. Cl.
| | |
|---|---|
| H01R 13/62 | (2006.01) |
| H05K 5/02 | (2006.01) |
| H01R 13/629 | (2006.01) |
| G06K 13/08 | (2006.01) |
| G11B 33/12 | (2006.01) |

(52) U.S. Cl.
CPC ....... *H05K 5/0295* (2013.01); *G06K 13/0806* (2013.01); *G11B 33/12* (2013.01); *H01R 13/629* (2013.01)

(58) Field of Classification Search
CPC .... H05K 5/0295; G11B 33/12; H01R 13/629; G06K 13/0806
USPC ................................................. 439/157, 152
See application file for complete search history.

(56) References Cited

U.S. PATENT DOCUMENTS

| | | | | |
|---|---|---|---|---|
| 5,383,789 A | * | 1/1995 | Watanabe | G06K 13/0806 361/754 |
| 5,536,180 A | * | 7/1996 | Ishida | G06K 13/0806 439/157 |
| 6,185,106 B1 | * | 2/2001 | Mueller | H05K 7/1409 361/754 |
| 6,247,946 B1 | * | 6/2001 | Nakamura | G06K 13/08 361/754 |
| 6,419,499 B1 | * | 7/2002 | Bundza | H05K 7/1451 439/377 |
| 6,582,241 B1 | * | 6/2003 | Lutz, Jr. | H05K 7/1409 439/157 |
| 6,884,096 B2 | * | 4/2005 | Centola | H01R 13/62933 361/798 |
| 6,966,786 B1 | | 11/2005 | Motojima et al. | |
| 7,057,904 B2 | * | 6/2006 | Bundza | H04Q 1/02 361/727 |
| 7,301,778 B1 | * | 11/2007 | Fang | H05K 7/1409 312/223.2 |

(Continued)

*Primary Examiner* — Abdullah A Riyami
*Assistant Examiner* — Nelson R. Burgos-Guntin
(74) *Attorney, Agent, or Firm* — Cindy Kaplan

(57) ABSTRACT

In one embodiment, an apparatus includes a line card ejector configured to engage with a chassis to retain the line card within a slot in the chassis in a closed position, a locking member movable between a locked position in which the ejector is locked in its closed position and an unlocked position in which the ejector may be moved to an open position to remove the line card from the chassis, and an actuation device for moving the locking member from its locked position to its unlocked position. The locking member comprises an accessible release lever for moving the locking member from its locked position to its unlocked position without use of the actuation device for emergency release and removal of the line card. A method for emergency release of the line card is also disclosed herein.

18 Claims, 8 Drawing Sheets

(56) References Cited

U.S. PATENT DOCUMENTS

| | | | |
|---|---|---|---|
| 7,534,116 B2* | 5/2009 | Ho | G06K 13/08 |
| | | | 439/159 |
| 8,435,057 B1* | 5/2013 | Jun | H05K 7/1409 |
| | | | 439/157 |
| 8,611,103 B2* | 12/2013 | Thomas | H05K 7/1489 |
| | | | 361/679.58 |
| 9,203,188 B1 | 12/2015 | Siechen et al. | |
| 9,420,716 B2* | 8/2016 | Ivey | H05K 7/1415 |
| 9,477,273 B2* | 10/2016 | Scherer | G06F 1/187 |
| 9,585,283 B2 | 2/2017 | Chia et al. | |
| 9,723,745 B2 | 8/2017 | Qi et al. | |
| 9,730,356 B2* | 8/2017 | Franz | H05K 7/1404 |
| 2002/0037658 A1* | 3/2002 | Ozawa | G06K 13/08 |
| | | | 439/159 |
| 2006/0223350 A1* | 10/2006 | Matsunaga | G06K 13/085 |
| | | | 439/152 |
| 2009/0156049 A1* | 6/2009 | Yen | H05K 5/0265 |
| | | | 439/377 |
| 2014/0187068 A1* | 7/2014 | Chia | H05K 7/1489 |
| | | | 439/160 |
| 2015/0044890 A1* | 2/2015 | Zhang | G06K 13/0812 |
| | | | 439/152 |
| 2015/0072549 A1* | 3/2015 | Okoshi | H01R 13/633 |
| | | | 439/160 |

* cited by examiner

LINE CARD EJECTOR WITH EMERGENCY RELEASE

TECHNICAL FIELD

The present disclosure relates generally to modular electronic systems, and more particularly, line card ejectors for modular electronic systems.

BACKGROUND

Modular electronic systems are designed to provide flexibility to configure systems as per user needs. These systems typically have multiple slots to accommodate a variety of modules (e.g., line cards, service cards, fabric cards, and the like). Most of these modules can be replaced with the latest product upgrades without disturbing normal operation of the system (i.e., hot swappable). As power consumption and networking requirements increase, the relationship of interconnect and mechanical assembly grows more complex at connection point physical interfaces. It continues to be important for the modules to be easily removed for replacement or repair.

BRIEF DESCRIPTION OF THE DRAWINGS

Corresponding reference characters indicate corresponding parts throughout the several views of the drawings.

DESCRIPTION OF EXAMPLE EMBODIMENTS

Overview

Figure 1:
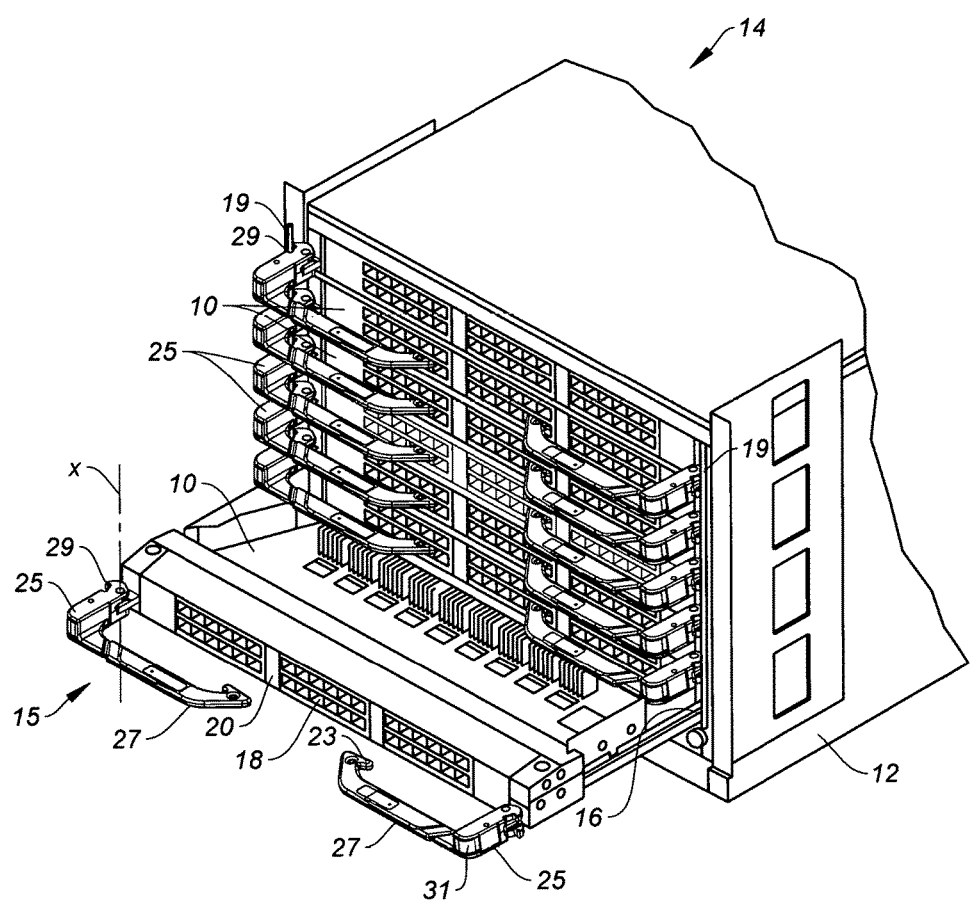
FIG. 1 is a perspective showing a chassis and line cards, in accordance with one embodiment.

In one embodiment, an apparatus generally comprises a line card ejector configured to engage with a chassis to retain a line card within a slot in the chassis in a closed position, a locking member movable between a locked position in which the line card ejector is locked in its closed position and an unlocked position in which the line card ejector may be moved to an open position for removal of the line card from the chassis, and an actuation device for moving the locking member from its locked position to its unlocked position. The locking member comprises an accessible release lever for moving the locking member from its locked position to its unlocked position without use of the actuation device for emergency release and removal of the line card.

In another embodiment, an apparatus generally comprises a chassis comprising a plurality of slots and a plurality of line cards inserted into the slots, each of the line cards comprising a pair of ejectors located at opposite sides of the line cards, the ejectors configured to engage with a bracket on the chassis to retain the line cards within the slots in the chassis when the ejectors are in a closed position, each of the ejectors comprising a locking member movable between a locked position in which the ejector is locked in its closed position and an unlocked position in which the ejector may be moved to an open position to remove the line card from the chassis, and an actuation device for moving the locking member from its locked position to its unlocked position, the locking member comprising an accessible release lever for moving the locking member from its locked position to its unlocked position without use of the actuation device for emergency release and removal of the line card.

In yet another embodiment, a method generally comprises receiving a first force at an actuation device of a line card ejector, wherein the actuation device fails to move a locking member from a locked position in which the ejector is locked in a closed position to an unlocked position in which the ejector may be moved to an open position, receiving a second force at a release lever of the locking member, and moving the locking member from its locked position to its unlocked position to allow for emergency release and removal of the line card from a network device.

Example Embodiments

The following description is presented to enable one of ordinary skill in the art to make and use the embodiments. Descriptions of specific embodiments and applications are provided only as examples, and various modifications will be readily apparent to those skilled in the art. The general principles described herein may be applied to other applications without departing from the scope of the embodiments. Thus, the embodiments are not to be limited to those shown, but are to be accorded the widest scope consistent with the principles and features described herein. For purpose of clarity, details relating to technical material that is known in the technical fields related to the embodiments have not been described in detail.

Network devices such as switches, routers, server racks, or other electronic devices may be configured as a modular electronic system with a plurality of removable modules (e.g., service cards, line cards, fabric cards, or other cards, components, or modules). As network requirements increase, the number of signal differential pairs per line card increases. An increase in bandwidth and network connections results in an increase in the number of connection points between a line card and a network device chassis. The increased number of connection points may cause a greater resistance when the line card is installed in the chassis or removed from the chassis. Mating and unmating forces may reach 200 pounds or higher. The high mating forces create insertion and removal issues along with ergonomic challenges.

In order to adapt to the above changes, line card ejectors have evolved from a low force module insertion/extraction device to mechanisms that need to provide electrical interface switching or loading along with ergonomic provisions capable of overcoming high insertion forces and allowing for maneuvering of complex Field Replaceable Units (FRUs) during upgrade installation. As ejectors have become more complex, the number of failures has increased. A broken ejector may prevent removal of a line card. With conventional systems, in the event of a catastrophic mechanical ejector failure, the ejector may be stuck in a locked position with the line card installed in the chassis, thus resulting in the need to ship the chassis to a service center to have the line card removed. This causes significant downtime, leading to customer satisfaction issues and concerns.

The embodiments described comprise a line card ejector system that provides an emergency release to enable the extraction of a line card in case of a mechanical failure that prevents removal of the line card, thereby eliminating the need to return an entire chassis for a failed line card ejector. As described below, one or more embodiments provide an ergonomic design for an ejector system for use with a line card/chassis interface with high line card insertion and extraction forces and high pin count/interconnection attachment points. In one or more embodiments, the ejector system may also provide additional features, such as RFID (Radio-Frequency Identification) capability, optical switch for status indication, internal locking mechanism, or an ejector lever that may be used as a handle to prevent direct contact with a line card board during handling of the line card by maintenance personnel or other users.

The embodiments described herein may operate in the context of a data communications network including multiple network devices. The network may include any number of network devices in communication via any number of nodes (e.g., routers, switches, gateways, controllers, edge devices, access devices, aggregation devices, core nodes, intermediate nodes, or other network devices), which facilitate passage of data within the network. The network devices may communicate over one or more networks (e.g., local area network (LAN), metropolitan area network (MAN), wide area network (WAN), virtual private network (VPN) (e.g., Ethernet virtual private network (EVPN), layer 2 virtual private network (L2VPN)), virtual local area network (VLAN), wireless network, enterprise network, corporate network, data center, Internet, intranet, radio access network, public switched network, or any other network). One or more of the network devices may comprise a modular electronic system comprising a line card ejector system as described herein. The network device may include one or more processor, memory, and network interfaces, as described below with respect to FIG. 6. One or more of these components may be located on a line card removably inserted into the network device.

It is to be understood that the term line card as used herein may refer to any modular electronic component, field replaceable unit, service card, line card, fabric card, or other card, component, or module configured for insertion and removal from a network device.

Referring now to the drawings, and first to FIG. 1, a plurality of line cards 10 are shown installed in a chassis frame 12 of a network device, generally indicated at 14. The chassis may include one or more frames or structures configured to support components and slidably receive any number of removable modules (line cards) 10. The chassis frame 12 may be formed from any suitable material including, for example, aluminum, steel, or any other metal, non-metal, or composite material. It is to be understood that the type, number, and arrangement of components and modules 10 shown in FIG. 1 is only an example and the chassis may include any number of slots 16 for receiving any number or type of modules 10 arranged in any format (e.g., positioned horizontally or vertically).

Figure 2:
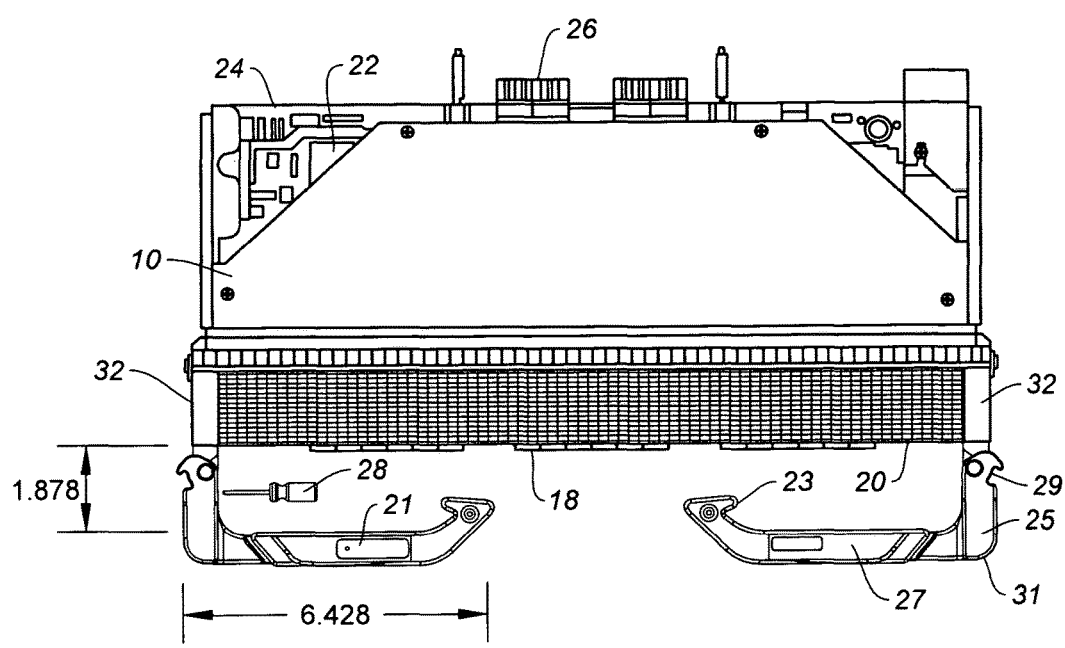
FIG. 2 is a top view of the line card shown in FIG. 1.

As shown in FIG. 2, the line card 10 includes a front panel (face plate) 20 and one or more electronic circuits 22 on a printed circuit board (PCB) 24. The line card 10 may include one or more processors, memory, and interfaces. The line card 10 may be coupled to data and/or power interfaces in the network device 14 (FIGS. 1 and 2). For example, one or more of the line cards 10 may be coupled to a backplane of the network device 14 for transmitting and receiving data. During insertion, connectors 26 located on a back of the line card 10 may engage corresponding connectors (not shown) located on the backplane of the system chassis. The line card 10 may allow the network device 14 to interface and communicate with other network devices or networks. For example, the line card 10 may include a plurality of ports 18 or other openings configured to receive connectors, cables, or pluggable transceiver modules (e.g., small form factor pluggable (SFP) transceiver modules, optical transceiver modules, etc.).

As shown in FIG. 1, the line card 10 may be inserted into one of the slots 16 of the chassis 12. Insertion of the line card 10 into the chassis 12 may require a user to apply an insertion force in excess of 350 pounds, for example (or any other force). To assist the user in generating the appropriate insertion force, each line card 10 may comprise a high insertion force ejector system, generally indicated at 15. In one or more embodiments, the ejector system 15 is configured to withstand high insertion and extraction forces (e.g., up to 350 pounds for high density module line card mating applications, or higher or lower force insertion and extraction forces), with ergonomic design considerations providing for reduced effort via the mechanical ejector design. This provides a safety factor if the maintenance personnel attempts to remove the line card without first engaging an unlocking device (e.g., mechanical release button, emergency release lever described below).

In the example shown in FIG. 1, the line card ejector system 15 comprises a pair of ejectors 25 located on opposite sides of the faceplate (front panel) 20 of the line card 10, for securely locking the line card in the slot 16 and preventing removal of the line card when the ejector is in its locked position. The line card ejectors 25 may be integral with the line card 10 or physically separable from the line card.

As shown in the example of FIG. 1, the chassis 12 includes a pair of brackets 19 extending vertically along opposing edges of the slots 16. Each ejector 25 comprises a hook (fingers) 29 for locking engagement with the bracket 19 when the ejector is in its closed position. As described in detail below, each ejector 25 further comprises a locking member (not shown in FIGS. 1 and 2) movable between a locked position in which the ejector is locked in its closed position and an unlocked position in which the ejector may be moved to an open position for removal of the line card 10 from the chassis 12. Each ejector 25 comprises a lever (also referred to herein as a handle) 27 rotatable about an X axis (pivot point) to disengage the hook 29 from the bracket 19 and allow for removal of the line card 10 from the slot 16 (FIG. 1).

The line card ejector system 15 may also be used to facilitate insertion and removal of the line card 10 into and from the slot 16 by providing a handle. The lever 27 may be used as a handle to carry the line card 10 and may be designed for ergonomic handling and comfort. For example, the lever 27 may permit module maneuver and be used as a handle (carrying point) to carry heavy and complex FRUs to prevent any direct contact with the circuit board 24 during handling (FIGS. 1 and 2). In one embodiment, the ejector handles 27 may be configured to support line card load weights significantly over conventional line card designs. Depending on the module weight, one or both levers 27 may be used to balance the load of the line card with maintenance personnel carrying the line card with one or two hands.

In one or more embodiments, each ejector lever 27 may be sufficiently spaced from the line card face plate 20 to allow room for placement of fingers around the lever (e.g., 1-2 inches or any other suitable distance) (FIG. 2). Also, the length of the lever 27 may be designed to provide sufficient area for a user to grip the handle (e.g., length of 6-7 inches or any other suitable length). The handle 27 may include a hook 23 at a free end thereof to prevent finger slippage during removal or insertion of the line card or line card carrying.

In one or more embodiments, the lever 27 may include an embedded RFID and associated plate 21. The RFID may be molded into the handle, for example, for easy identification of the line card.

As previously noted, the lever 27 is free to rotate and move the ejector 25 to its open position upon unlocking the locking member within the ejector. In one or more embodiments, the locking member may be moved from its locked position to its unlocked position upon pressing a button (actuation device) 31 located at one end of the lever 27 (FIG. 1) or by using a tool 28 to access an emergency release lever (FIG. 2) if the button does not work (e.g., stuck, jammed, or broken button or related mechanism or component).

As described in detail below, the line card ejector system 15 includes an emergency eject/release feature that allows for removal of the line card 10 from the chassis frame 12 in the event of a catastrophic failure of one or more components of the line card ejector system. This allows the line card 10 to be removed and replaced without shipping the entire chassis back to the manufacturer for disassembly and removal of the line card.

In one embodiment, the tool 28 may be used to actuate the emergency release, as shown in FIG. 2. The tool 28 may comprise, for example, a small rod or pin (e.g., with 2 mm diameter (or smaller or larger)), which may be connected to a handle. It is to be understood that the tool 28 shown in FIG. 2 is only an example and any other suitable device may be used to activate the emergency release system. The tool 28 may be provided with the ejector system 15 or any device comprising an appropriately sized cylindrical member with a diameter sufficiently small enough to fit within an opening in the ejector and long enough to reach an emergency release lever connected to the locking member may be used. Once the locking member is unlocked, the ejector 25 is free to move (rotate) to its open position (hook 29 rotated away from bracket 19) and the line card 10 may be removed from the chassis 12 (FIGS. 1 and 4C).

Removal of the line card 10 from the chassis 12 while the line card is still in operation may cause damage to the line card or may corrupt data stored in memory of the line card. In one or more embodiments, the line card ejector 25 may provide a signal to the line card 10 to indicate an imminent removal of the line card from the network device 14 prior to removal of the line card. This may allow the line card 10 to perform one or more shutdown operations, which may help to prevent damage to components of the line card and prevent corruption of data stored in memory of the line card. An internal optical sensor switch may be provided to signal that the module is online or offline, along with any other desired features. The optical switch may provide electromechanical recognition of board status. In one example, when the ejector 25 is in its closed position, a slider (described below) connected to the ejector is removed from an optical switch and the switch is on. When the lever 27 is rotated and the ejector 25 is in its open position, the slider is moved into the optical switch and blocks an emitted light to turn the optical switch off. The ejector system 15 may include, for example, a sensor component configured to detect imminent removal of the line card 10 from the chassis 12 of the network device 14, as described in U.S. Pat. No. 9,723,745, or any other suitable sensor.

It is to be understood that the configuration shown in FIGS. 1 and 2 is only an example and that the chassis may be configured for receiving any number or type of modules (line cards), including, for example, fabric cards, line cards, service cards, combo cards, controller cards, processor cards, high density line cards, high power line cards, high density and power line cards.

Figure 3A:
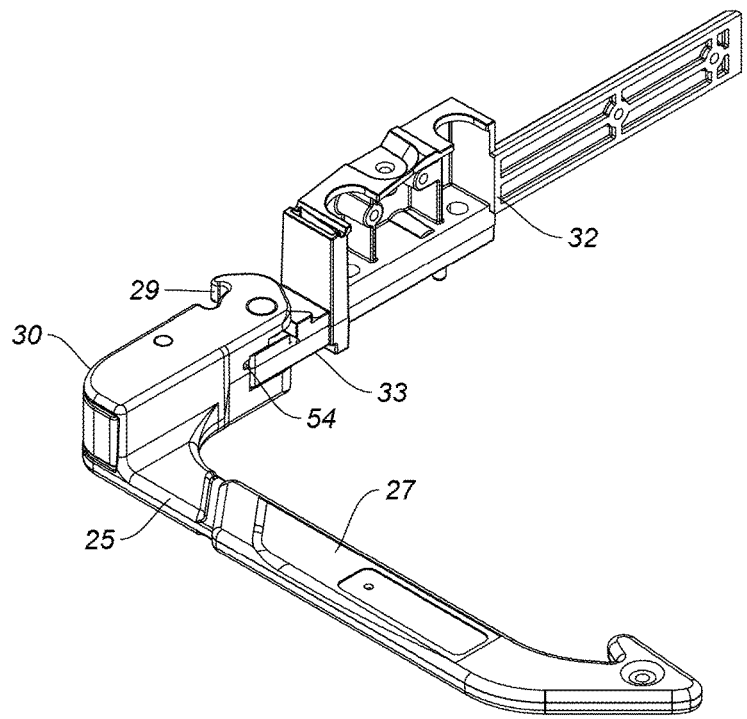
FIG. 3A is a perspective of an ejector, in accordance with one embodiment.
Figure 3B:
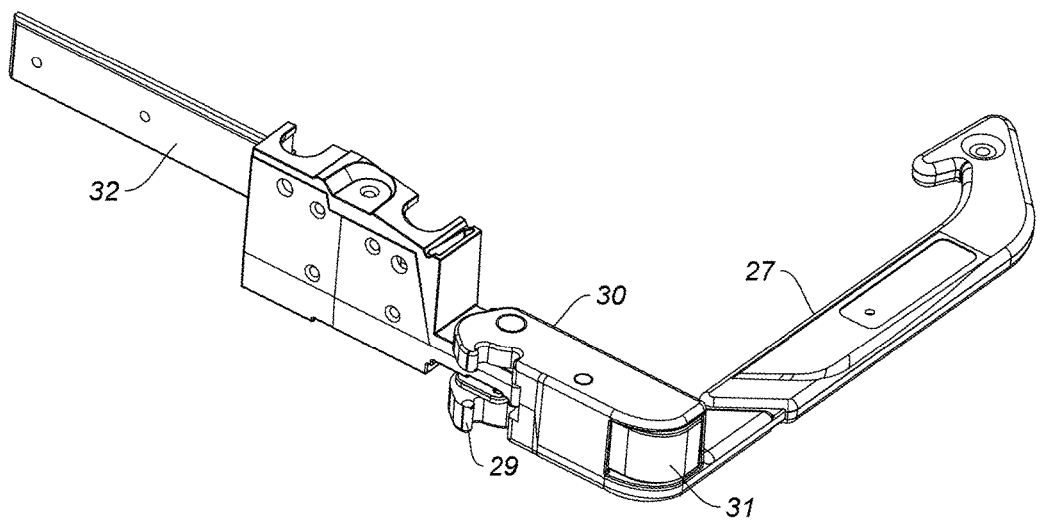
FIG. 3B is a perspective of the ejector of FIG. 3A from another viewpoint.

FIGS. 3A and 3B show additional details of the ejectors with the line cards 10 removed. Each ejector comprises the lever 27 attached (e.g., integral, removably attached) to a connecting member (cam member) 30 comprising the hook (fingers) 29 for engagement with the chassis bracket 19 (FIG. 1), the release button 31, line card attachment bracket 32, and a plurality of subcomponents (springs, cams, brackets, pivot pins, levers, etc.) shown in FIGS. 3C and 3D and described below, for use in the locking system, emergency release system, and optional optical switch system. FIGS. 3A and 3B show the ejector system in a locked and closed position.

It is to be understood that the line card attachment bracket 32 described herein is only an example for attachment of the ejector 25 to the line card 10, and the line card attachment bracket may comprise any type or configuration of bracket for mating the ejector with the line card (FIG. 2). As previously noted, the line card attachment bracket 32 may be integrally formed with the line card 10 or removably connected thereto.

Figure 3C:
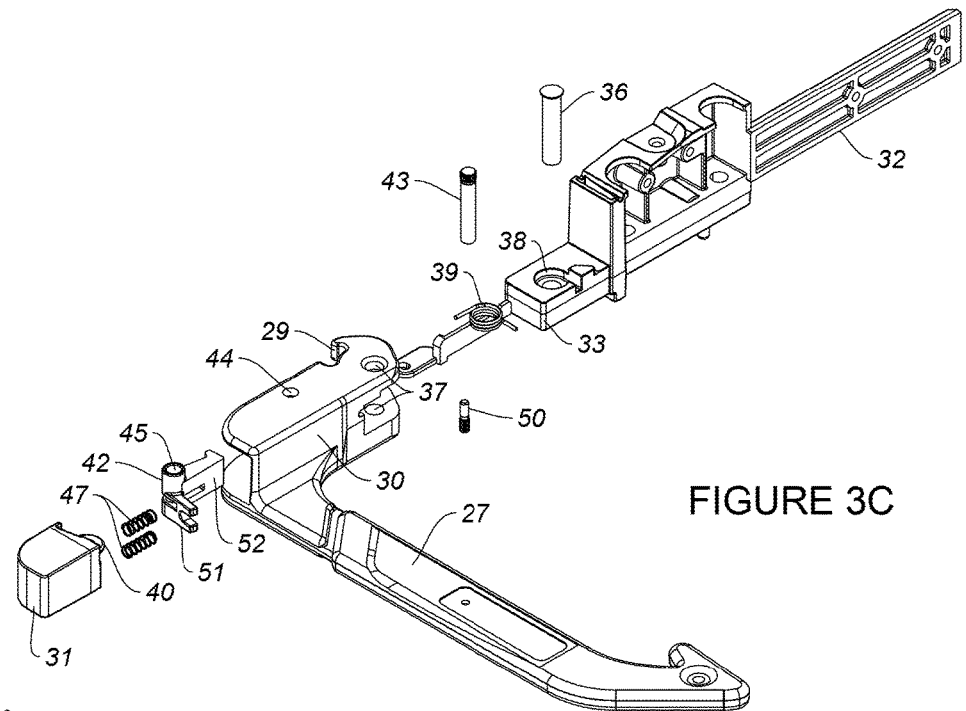
FIG. 3C is an exploded view of the ejector shown in FIG. 3A.
Figure 3D:
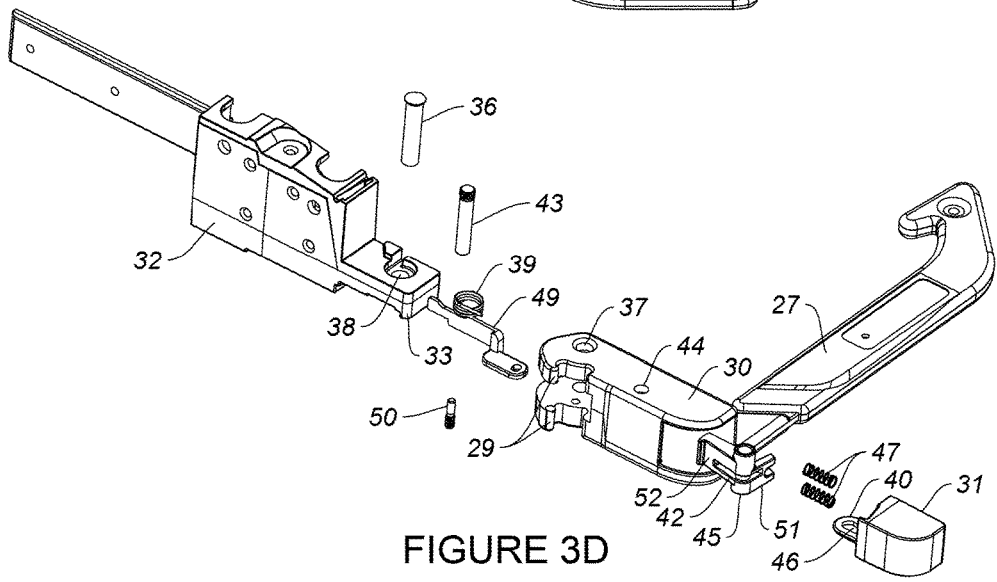
FIG. 3D is an exploded view of the ejector shown in FIG. 3B.

FIGS. 3C and 3D are exploded views of the ejectors shown in FIGS. 3A and 3B, respectively. As described above with respect to FIG. 1, the connecting member (cam member) 30 comprises a pair of fingers 29 configured to engage with the bracket 19 on the chassis 12 to lock the line card 10 in place. In the example shown in FIGS. 3C and 3D, the connecting member 30 is integral with the lever (handle) 27. The connecting member 30 (and attached lever 27) is rotatable around pivot pin 36 that passes through aligned openings 37 in parallel faces of the connecting member, and opening 38 in flange 33 extending from the line card attachment bracket 32. The pivot pin 36 also passes through torsion spring 39, which retains the ejector in its closed position. One end of the connecting member 30 adjacent to the lever 27, includes an opening for receiving a locking member 42 and button 31. The other end of the connecting member (adjacent to the locking fingers 29) includes an opening for receiving the flange 33 extending from the line card attachment bracket 32.

Figure 4A:
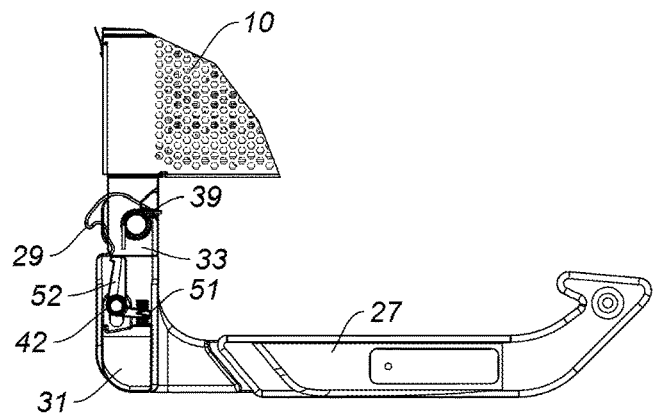
FIG. 4A is a top view of the ejector in a locked and closed position.

In the example shown and described herein, the locking member 42 is generally an L-shaped member comprising an arm 51 with a horizontal slot for receiving a bracket 40 extending from the button 31, and a release lever 52 for engagement with a front surface of the flange 33 when the locking member is in its locked position, as shown in FIG. 4A and described below. The arm 51 and release lever 52 are connected to a tubular member 45 that receives pivot pin 43, which also passes through opening 44 in an upper face of the connecting member 30 and slot 46 in the bracket 40 extending from the button 31.

Springs 47 maintain arm 51 of the locking member 42 and button 31 in the locked position. An axial force pressing on the button 31 in a direction along a longitudinal axis of the connecting member 30, compresses the springs 47, and forces the arm 51 of the locking member 42 to rotate around the pivot point 43, thereby causing the rigid release lever 52 to disengage from flange 33 and unlock the locking member, as shown in FIG. 4B and described further below.

As previously noted, an optical switch may be included to provide an indication as to when the line card 10 is being removed so that power to electrical components may be shut down as needed. An optical switch activation slide 49 is configured for linear movement into and out of the optical switch (not shown). In the example shown in FIGS. 3C and 3D, the slide 49 is attached to a bottom face of the connecting member 30 by pivot pin 50. As the connecting member 30 rotates from its closed position (FIG. 4A) to its open position (FIG. 4C), slide 49 moves into a path of the optical switch, thereby turning the switch off.

Figure 4B:
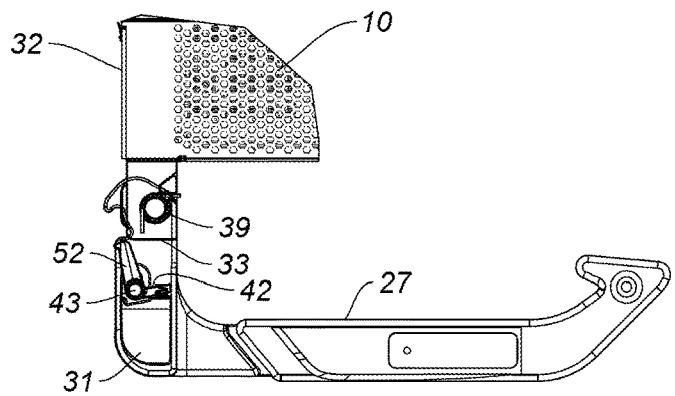
FIG. 4B is a top view of the ejector in an unlocked and closed position.
Figure 4C:
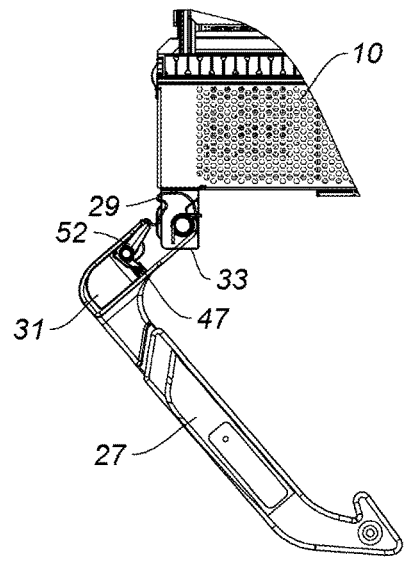
FIG. 4C is a top view of the ejector in an unlocked and open position.

Referring now to FIGS. 4A, 4B, and 4C, interaction of the components shown in FIGS. 3A-3D and described above, are illustrated with the ejector in a locked and closed position (FIG. 4A), unlocked and closed position (FIG. 4B), and unlocked and open position (FIG. 4C).

FIG. 4A shows the ejector in its locked position before the release button 31 is depressed. The release lever 52 of the locking member 42 is in contact with a face of the flange 33 and fingers 29 of the connecting member 30 are in a closed position (e.g., engaged with locking bracket 19 as shown in FIG. 1). In this position, the handle 27 cannot be rotated to remove the line card 10 due to engagement of the locking member 42 with the flange 33.

FIG. 4B shows the release button 31 depressed and the locking member 42 unlocked. As the button 31 is pressed, the locking member 42 rotates about its pivot point 43 and the lever 52 is moved away from engagement with the flange 33 of the line card attachment bracket 32. This allows the ejector to be moved to its open position through rotation of the handle 27 as shown in FIG. 4C, thereby releasing the line card 10 for removal from the chassis 12 (FIGS. 1 and 4C). As the handle 27 is rotated, the button 31 is reset due to a biasing load from springs 47 and the locking member is free to move back to its locked position once the handle 27 is rotated back to its closed position.

When the line card 10 is inserted back into the slot 16 in the chassis 12, the handle 27 is rotated as shown in FIG. 4C, and after the line card is in position, the handle is rotated to close and lock the ejector as shown in FIG. 4A. As the handle 27 rotates towards the line card 10, the fingers 29 of the connecting member 30 engage with the bracket 19 and the locking member lever 52 engages with the flange 33 of the line card attachment bracket 32 to lock the line card in place (FIGS. 1 and 4A).

Figure 5A:
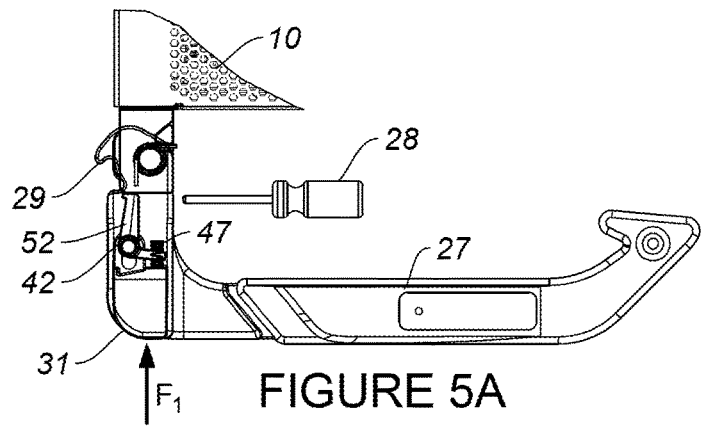
FIG. 5A is a top view of the ejector with a tool for use in activating an emergency ejector release.
Figure 5B:
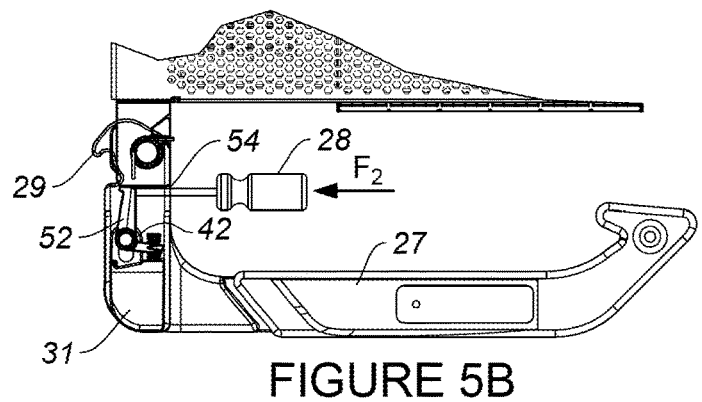
FIG. 5B is a top view of the ejector with the tool inserted into an opening for activating the emergency ejector release.
Figure 5C:
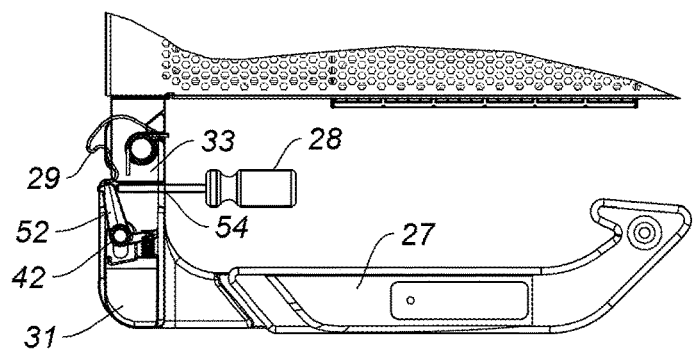
FIG. 5C is a top view of the ejector with the tool inserted and the ejector unlocked.

FIGS. 5A-5C illustrate an emergency release system, in accordance with one embodiment. FIG. 5A shows the ejector 25 in a locked and closed position. In this example, one or more components of the actuation device (button) 31 have failed and the ejector cannot be unlocked or opened in normal operation as described above with respect to FIGS. 4A-4C. For example, the release button 31 or spring 47 may be broken and no longer operable to move the locking member 42 from its locked position to its unlocked position. The emergency release tool 28 is inserted into an opening 54 in the connecting member 30 (FIGS. 3A and 5B) and engages with the lever 52 of the locking member 42 to release the lever and activate the emergency release system, as shown in FIG. 5C. Once the lever 52 is moved away from engagement with the flange 33, the handle 27 is free to rotate, thereby releasing the locking fingers 29 of the connecting member 30 from the bracket 19 to allow for emergency release and removal of the line card 10 from the chassis 12 (FIGS. 1 and 5C). The line card 10 may be removed from the chassis 12 and returned to the vendor for repair without the need to return the entire chassis with the broken line card installed.

Figure 6:
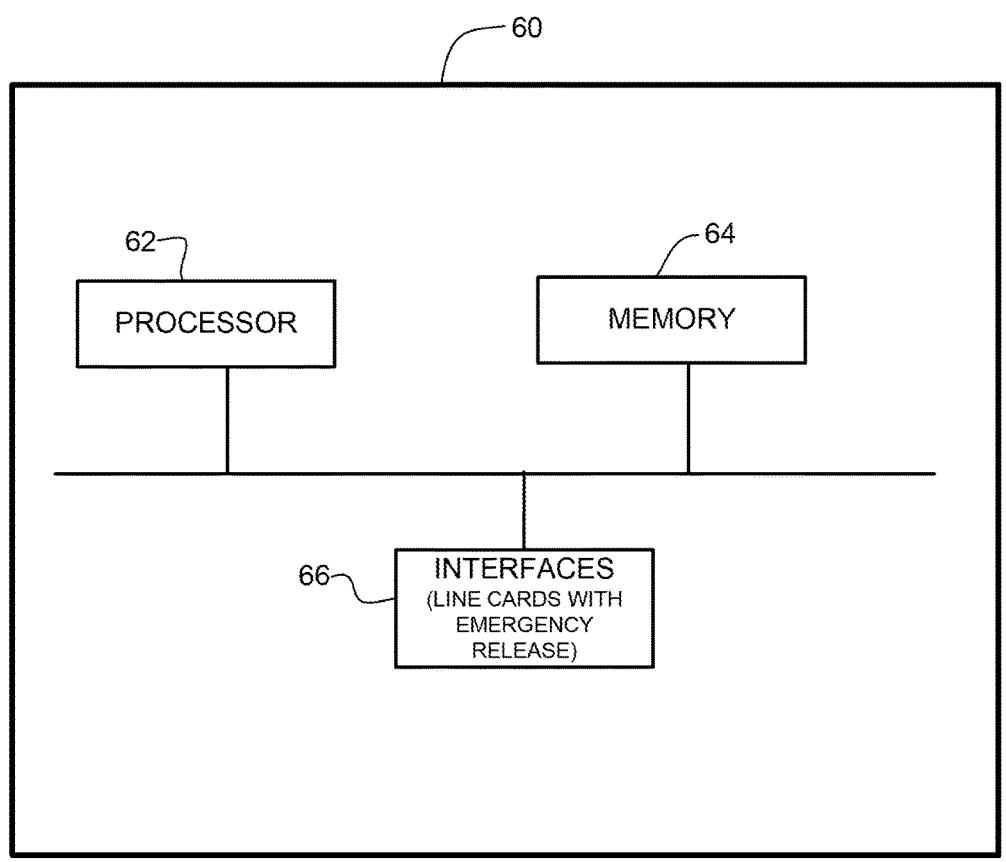
FIG. 6 illustrates an example of a network device in which the embodiments described herein may be implemented.

As previously noted, the embodiments described herein may operate in the context of a network device. In one embodiment, the network device is a programmable machine that may be implemented in hardware, software, or any combination thereof. The network device 60 includes one or more processor 62, memory 64, and network interfaces (line cards) 66 (FIG. 6). One or more of the components (e.g., processor, memory) may be located on the line card 10.

Memory 64 may be a volatile memory or non-volatile storage, which stores various applications, operating systems, modules, and data for execution and use by the processor 62. The network device 60 may include any number of memory components.

Logic may be encoded in one or more tangible media for execution by the processor 62. For example, the processor 62 may execute codes stored in a computer-readable medium such as memory 64. The computer-readable medium may be, for example, electronic (e.g., RAM (random access memory), ROM (read-only memory), EPROM (erasable programmable read-only memory)), magnetic, optical (e.g., CD, DVD), electromagnetic, semiconductor technology, or any other suitable medium. In one example, the computer-readable medium comprises a non-transitory computer-readable medium. In one or more embodiments, the processor 62 may process signals received from the optical switch to identify line card status, for example. The processor 62 may process data received from the interfaces 66. The network device 60 may include any number of processors 62.

The network interfaces 66 may comprise any number of interfaces (line cards 10) for receiving data or transmitting data to other devices.

It is to be understood that the network device 60 shown in FIG. 6 and described above is only a simplified example and that the embodiments described herein may be implemented in different configurations of network devices. For example, the network device 60 may further include any suitable combination of hardware, software, algorithms, processors, devices, components, or elements.

Figure 7:
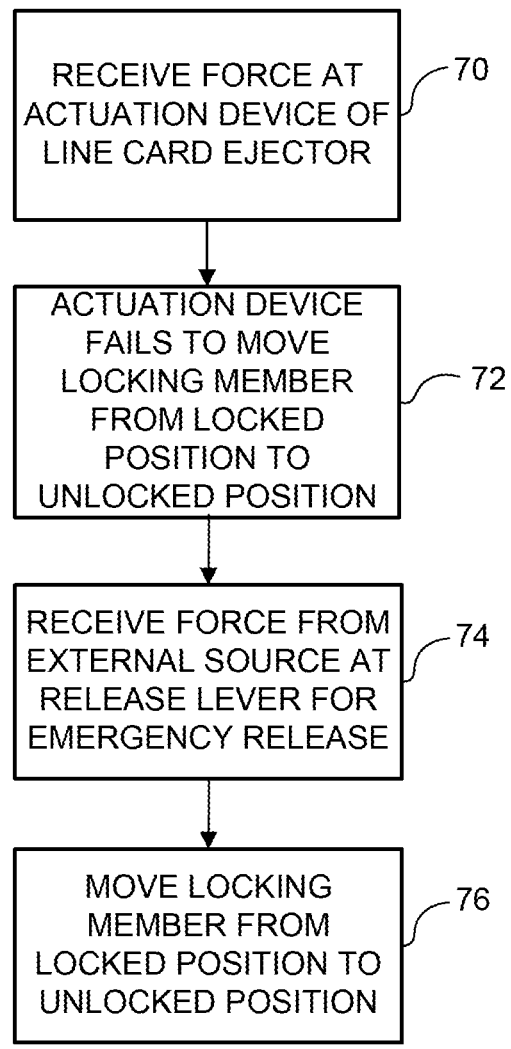
FIG. 7 is a flowchart illustrating an overview of a process for emergency release of the ejector, in accordance with one embodiment.

FIG. 7 is a flowchart illustrating an overview of a method for emergency release of the ejector, in accordance with one embodiment. At step 70, a first force ($F_1$ in FIG. 5A) is received at an actuation device (e.g., button 31) of a line card ejector 25 (FIG. 1). This force may result from depressing the button 31, for example. Upon receiving the opening force, the actuation device 31 fails to move the locking member 42 from a locked position in which the ejector 25 is locked in a closed position to an unlocked position in which the ejector may be moved to an open position (step 72) (FIGS. 5A and 7). A second force ($F_2$ in FIG. 5B) is then received from an external source (e.g., tool 28) at the release lever 52 of the locking member (step 74). The locking member 42 is then moved from its locked position to its unlocked position (step 76) (FIGS. 5C and 7). The ejector handle 27 is now free to rotate to open the ejector and remove the line card 10 from the network device 14 (FIG. 1).

It is to be understood that the process shown in FIG. 7 is only an example and steps may added, combined, or modified, without departing from the scope of the embodiments.

Although the method and apparatus have been described in accordance with the embodiments shown, one of ordinary skill in the art will readily recognize that there could be variations made to the embodiments without departing from the scope of the embodiments. Accordingly, it is intended that all matter contained in the above description and shown in the accompanying drawings shall be interpreted as illustrative and not in a limiting sense.

What is claimed is:

1. An apparatus comprising:
a line card ejector configured to engage with a chassis to retain a line card within the chassis in a closed position;
a locking member movable between a locked position in which the line card ejector is locked in said closed position and an unlocked position in which the line card ejector may be moved to an open position for removal of the line card from the chassis; and
an actuation device for moving the locking member from said locked position to said unlocked position;
wherein the locking member comprises an accessible release lever for moving the locking member from said locked position to said unlocked position without use of the actuation device, for emergency release and removal of the line card.

2. The apparatus of claim 1 wherein the release lever is accessible by a tool and the line card ejector comprises an opening for receiving the tool.

3. The apparatus of claim 1 wherein the release lever is rotatable about a pivot point for disengagement from a line card bracket.

4. The apparatus of claim 1 wherein the release lever is spring loaded for engagement with a line card bracket when the locking member is in said locked position.

5. The apparatus of claim 1 wherein the actuation device comprises a button on the line card ejector.

6. The apparatus of claim 1 wherein the line card ejector comprises a rotatable hook engageable with a bracket on the chassis when the line card is inserted into the chassis and the line card ejector is in said closed position.

7. The apparatus of claim 1 wherein the line card ejector comprises a handle rotatable to move the line card ejector to said open position when the locking member is in said unlocked position.

8. The apparatus the claim 7 wherein the handle is spaced from the line card and configured for use in carrying the line card.

9. The apparatus of claim 1 wherein the line card ejector comprises an optical switch slide operable to provide an indication when the line card ejector moves between said closed position and said open position.

10. An apparatus comprising:
a chassis comprising a plurality of slots; and
a plurality of line cards inserted into said plurality of slots;
each of the line cards comprising a pair of ejectors located at opposite sides of the line cards, the ejectors configured to engage with a bracket on the chassis to retain the line cards within the slots in the chassis, in a closed position;
each of the ejectors comprising a locking member movable between a locked position in which the ejector is locked in said closed position and an unlocked position in which the ejector may be moved to an open position to remove the line card from the chassis, and an actuation device for moving the locking member from said locked position to said unlocked position;
the locking member comprising an accessible release lever for moving the locking member from said locked position to said unlocked position without use of the actuation device, for emergency release and removal of the line card.

11. The apparatus of claim 10 wherein the release lever is accessible by a tool and the ejector comprises an opening for receiving the tool.

12. The apparatus of claim 10 wherein the release lever is rotatable about a pivot point for disengagement from a line card bracket.

13. The apparatus of claim 10 wherein the release lever is spring loaded for engagement with a line card bracket when the locking member is in said locked position.

14. The apparatus of claim 10 wherein the actuation device comprises a button on the ejector.

15. The apparatus of claim 10 wherein the ejector comprises a rotatable hook engageable with a bracket on the chassis when the line card is inserted into the chassis and the ejector is in said closed position.

16. The apparatus of claim 10 wherein the ejector comprises a handle rotatable to move the ejector to said open position when the locking member is in said unlocked position.

17. The apparatus of claim 10 wherein the ejector comprises an optical switch slide operable to provide an indication when the ejector moves between said closed position and said open position.

18. The apparatus of claim 16 wherein the handle is spaced from the line card and configured for use in carrying the line card.

* * * * *